US006653240B2

(12) United States Patent
Crawford

(10) Patent No.: US 6,653,240 B2
(45) Date of Patent: Nov. 25, 2003

(54) FIB/RIE METHOD FOR IN-LINE CIRCUIT MODIFICATION OF MICROELECTRONIC CHIPS CONTAINING ORGANIC DIELECTRIC

(75) Inventor: Edward J. Crawford, Hopewell Junction, NY (US)

(73) Assignee: International Business Machines Corporation, Armonk, NY (US)

(*) Notice: Subject to any disclaimer, the term of this patent is extended or adjusted under 35 U.S.C. 154(b) by 251 days.

(21) Appl. No.: 09/759,101

(22) Filed: Jan. 12, 2001

(65) Prior Publication Data

US 2002/0173148 A1 Nov. 21, 2002

(51) Int. Cl.[7] .............................................. H01L 21/302
(52) U.S. Cl. ....................... 438/712; 438/717; 438/720; 438/724; 438/725
(58) Field of Search ................................. 438/706, 712, 438/708, 717, 720, 724, 725

(56) References Cited

U.S. PATENT DOCUMENTS

| | | | |
|---|---|---|---|
| 4,908,226 A | 3/1990 | Kubena et al. | |
| 5,140,164 A | 8/1992 | Talbot et al. | |
| 5,289,416 A | 2/1994 | Iwai et al. | |
| 5,483,490 A | 1/1996 | Iwai et al. | |
| 5,629,137 A | 5/1997 | Leedy | |
| 5,741,727 A | 4/1998 | Wang | |
| 5,832,595 A | 11/1998 | Maruyama et al. | |
| 5,926,688 A | 7/1999 | Lee et al. | |
| 6,028,363 A | * 2/2000 | Lin | 257/774 |
| 6,165,695 A | * 12/2000 | Yang et al. | 430/314 |
| 6,200,888 B1 | * 3/2001 | Ito et al. | 438/597 |
| 6,225,626 B1 | * 5/2001 | Talbot et al. | 250/307 |
| 6,383,907 B1 | * 5/2002 | Hasegawa et al. | 438/597 |

FOREIGN PATENT DOCUMENTS

| | | |
|---|---|---|
| JP | 9-22984 | 1/1997 |
| JP | 10-32205 | 2/1998 |

* cited by examiner

Primary Examiner—Benjamin L. Utech
Assistant Examiner—Binh X. Tran
(74) Attorney, Agent, or Firm—James J. Cioffi, Esq.; McGinn & Gibb, PLLC

(57) ABSTRACT

A method for circuit modification of an microelectronic chip having at least one conductor in an organic dielectric, includes applying a protective inorganic surface layer on top of the organic dielectric, forming at least one window in the protective inorganic surface layer to selectively expose the underlying organic dielectric, etching the organic dielectric in the window area to selectively remove the organic dielectric adjacent to the conductor, and performing at least one process that modifies the conductor.

23 Claims, 4 Drawing Sheets

FIB/RIE METHOD FOR IN-LINE CIRCUIT MODIFICATION OF MICROELECTRONIC CHIPS CONTAINING ORGANIC DIELECTRIC

BACKGROUND OF THE INVENTION

1. Field of the Invention

The present invention generally relates to repair or circuit modification of microelectronic chips particularly during manufacture. More specifically, chips having conductors, typically copper or aluminum, embedded in organic dielectric layers can be modified after the conductors have been formed. This organic dielectric layer is also variously described in the art by terminology such as low-k dielectric, spin-on glass, or spin-on dielectric.

2. Description of the Related Art

The Focused Ion Beam (FIB) tool is well known in the art for ion milling and has been used for chip analysis, modification, and repair. A typical conventional system utilizes bromine gas and a focused ion beam to selectively mill aluminum lines in a silicon oxide dielectric, a procedure that slices through the conductor to create an electrical open circuit. The complementary procedure of adding conductive material to create shorts or to connect two conductors is done by ion-assisted deposition of a metal such as tungsten from a gaseous metal precursor onto the area to be connected. This conventional method of creating electrical disconnections is not applicable to organic dielectric/ metallization schemes because no gas is commercially available that ensures the complete removal of residual metal, such as copper, in the milled area. More important, ion milling utilizes charged ions that impregnate the organic dielectric to defeat electrical isolation.

Conventional methods using FIB milling concern aluminum lines in silicon oxide and does not work for tight pitch copper lines in low-k dielectric materials. Thus, until now no effective method exists to allow circuit modification of chips with organic dielectric layers. The disclosed technique overcomes the above mentioned problems of charged ions and residual metal by using a combination of selective dielectric removal and FIB milling.

SUMMARY OF THE INVENTION

In view of the foregoing and other problems of the conventional methods, it is, therefore, an object of the present invention to provide a method for repairing metal lines in low-k organic dielectrics.

It is another object of the invention to allow real-time circuit modifications on-chip on such chips when a circuit design change needs to be evaluated or a mask error needs to be corrected.

It is another object of the invention to allow conductor lines in low-k organic dielectrics to be selectively disconnected or selectively connected.

It is another object of the invention to improve yields on such chips, especially on large area chips where chip interconnect problems can be a major yield detractor.

It is another object of the invention to allow repairs on chips having organic dielectric/metal combinations, especially when conductor lines are closely spaced.

In a first exemplary aspect, a method for making an organic dielectric/copper modification involves: depositing an inorganic dielectric material such as nitride to form a surface protective layer; making an opening above the selected work area through this protective layer either by ion milling or by a standard mask/resist process; removing organic dielectric material adjacent to the targeted copper line by an oxygen Reactive Ion Etching (RIE) process; and, modifying the exposed conductor by either cutting the copper line by FIB milling (typically with a passivating gas such as xenon diflouride) or by depositing more conductive material to form a connection to another conductor. Repairs would normally be followed by routine deposition of an insulating layer such as silicon oxide to fill in the void of the removed organic dielectric and then a planarization process to equalize surface contours. Repairs of underlying conductors can be done by executing the basic process for each successive underlying dielectric layer.

With the invention, the problem in the prior art is overcome in which ion milling creates charged ions that impregnate the organic dielectric to defeat electrical isolation. The invention also overcomes the problem in the prior art of electrically conductive metal residue from ion milling being deposited on the sidewalls around the milled area, defeating electrical isolation.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 1A:
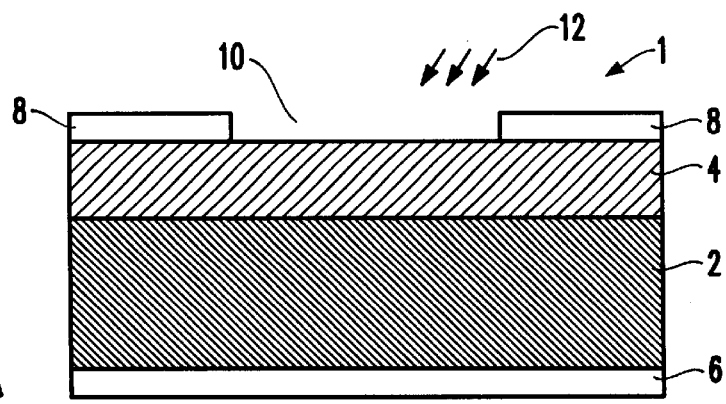
FIGS. 1(a) through 1(d) illustrate the basic technique for a single organic dielectric layer and one conductor.

Referring now to the drawings, generally, the invention utilizes a combination of FIB (Focused Ion Beam) and RIE (Reactive Ion Etching) techniques to repair conductor lines on chips that use organic dielectric. FIGS. 1(a) through 1(d), as summarized by the flowchart on FIG. 2, illustrate the steps of one exemplary embodiment of the invention for a single layer.

FIG. 1(a) shows a cross section of a portion of a chip 1 having organic layer 2 in which is embedded a conductor 4, typically a metal such as copper or aluminum. In this example, conductor 4 is considered to be a copper line. In general, the organic dielectric layer 2 will be isolated from underlying layers (not shown) by a protective layer 6, typically a nitride barrier layer. Such organic dielectric layers are known in the art under various terms, including low K dielectric, low conductivity dielectric, and spin-on glasses (SOG). Since it is applied as a thin film liquid, the primary advantage of spin-on dielectrics is the simplicity of applying a layer to a wafer. Although copper line 4 appears in the cross section in FIG. 1(a) as lying on top of organic dielectric 2, the line is typically embedded in the layer so that the organic dielectric material is in contact with both sides as well as the bottom of copper line 4.

Wafers with chips to be repaired are removed from the manufacturing flow. Of course, this initial step is not to be interpreted as a limitation of the invention, since the disclosed process can be carried out at any stage of manufacture, including a completed chip.

Figure 2:
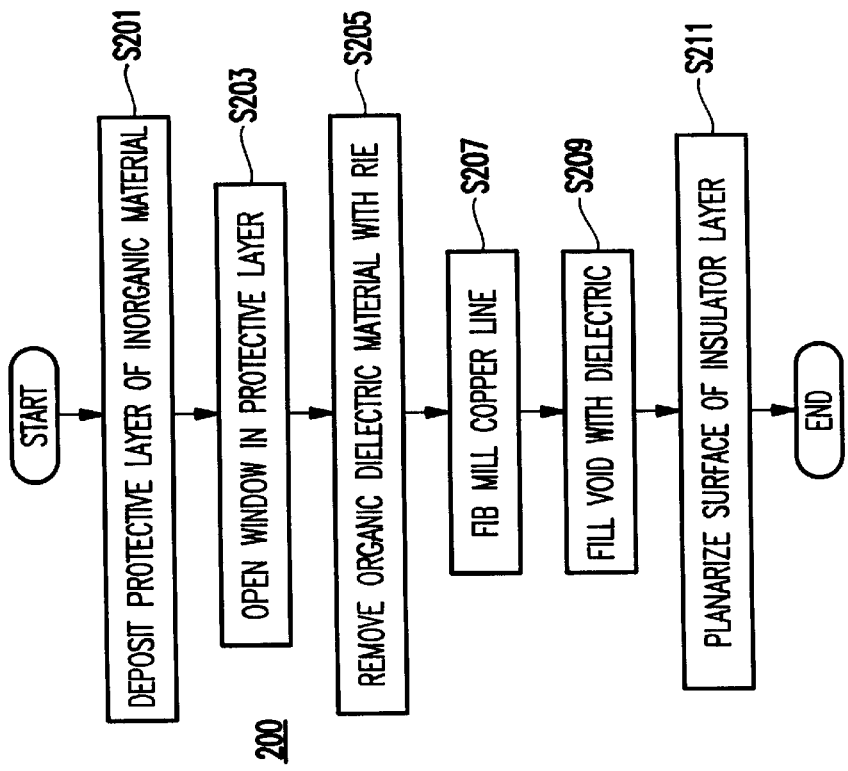
FIG. 2 is a flow chart for a preferred method 200 of the invention with a single layer, as illustrated by FIGS. 1(a) through 1(d)

As shown in the flowchart in FIG. 2, a first step (S201) of the inventive method 200 is the application of a protective barrier layer 8 of inorganic material on the surface of the chip. Typically, this step includes the deposition of nitride, but other inorganic materials such as an oxide could be used.

Next, a window 10 in barrier layer 8 is opened (S203) over the area to be modified. This window could be created by FIB-ion-milling through the nitride barrier 8), shown in FIG. 1(a) as beams 12 impinging on the surface. Alternatively, the window could be formed by a standard process in which an organic resist is deposited in a masked pattern so that the nitride barrier is left exposed for a standard etching process such as RIE. Both techniques for opening a window are well known in the art. Other techniques are possible, but the window cannot be created with techniques that would damage the underlying copper line.

Figure 1B:
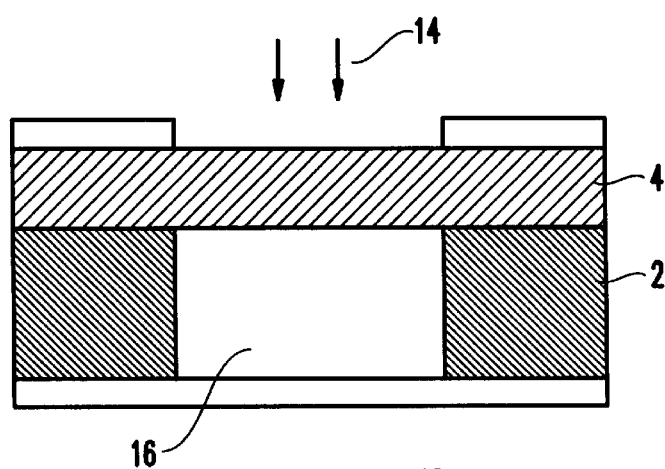

The wafer is then etched (S205) using a RIE process selective to the organic dielectric such that the dielectric is removed between metal features in the exposed area only. Typical RIE gas mixtures for removing organic dielectrics contain varying amounts of oxygen. This etching is shown in FIG. 1(b) as arrows 14, and the etching process results in a removal of the organic dielectric adjacent to targeted line 4, as shown by void area 16 and would typically remove the dielectric on each side of and partially below the targeted line to isolate the line from the surrounding dielectric. The amount of material removed below the line is not critical for a single conductor modification. This RIE etching is well known in the art and details are routinely determined experimentally for specific dielectrics and layer depths.

The modification to line 4 could be either that of connecting to another line (not shown) or cutting through line 4 to disconnect. The connection process typically includes FIB-assisted deposition of tungsten or molybdenum and is well known in the art. Illustrated in this discussion of a preferred embodiment is the process of cutting through line 4 to create a disconnect.

Figure 1C:
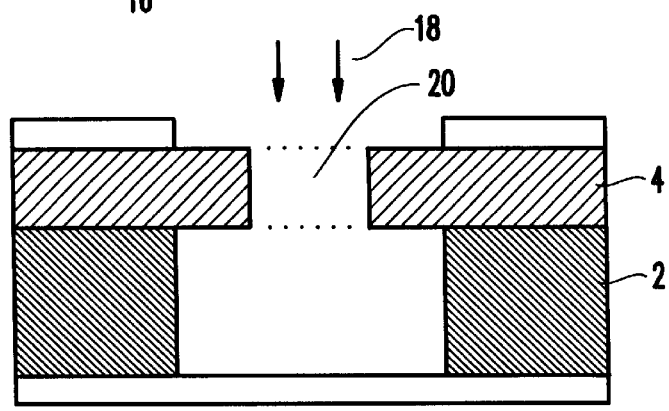
Figure 1D:
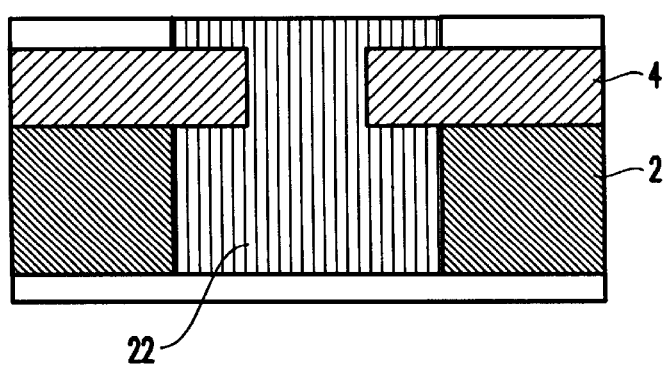

To make the disconnect of line 4, the wafer is returned to the FIB for ion milling (S207) through the line. FIG. 1(c) shows milled-out section 20 having been achieved by FIB beams 18 so that line 4 is now disconnected. For closely-spaced copper conductors, gas assisted etch using xenon difluoride may be employed to ensure disconnection. Shown in FIG. 1(d), an insulating layer 22, typically $SiO_2$, is then deposited (S209) to fill the empty spaces. Finally, planarization (S211) is typically done to level off the surface and avoid effecting higher level processing, using any of well known alternative techniques.

Figure 3A:
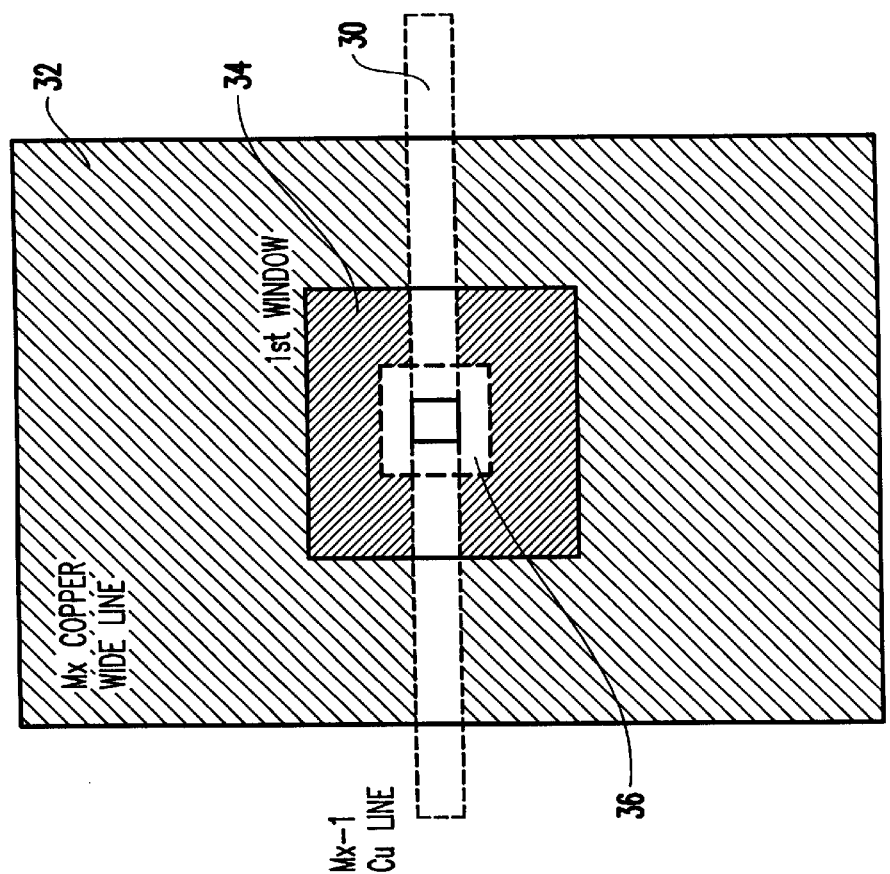
FIGS. 3(a) through 3(c) illustrate the technique as extended for multiple layers.
Figure 3B:
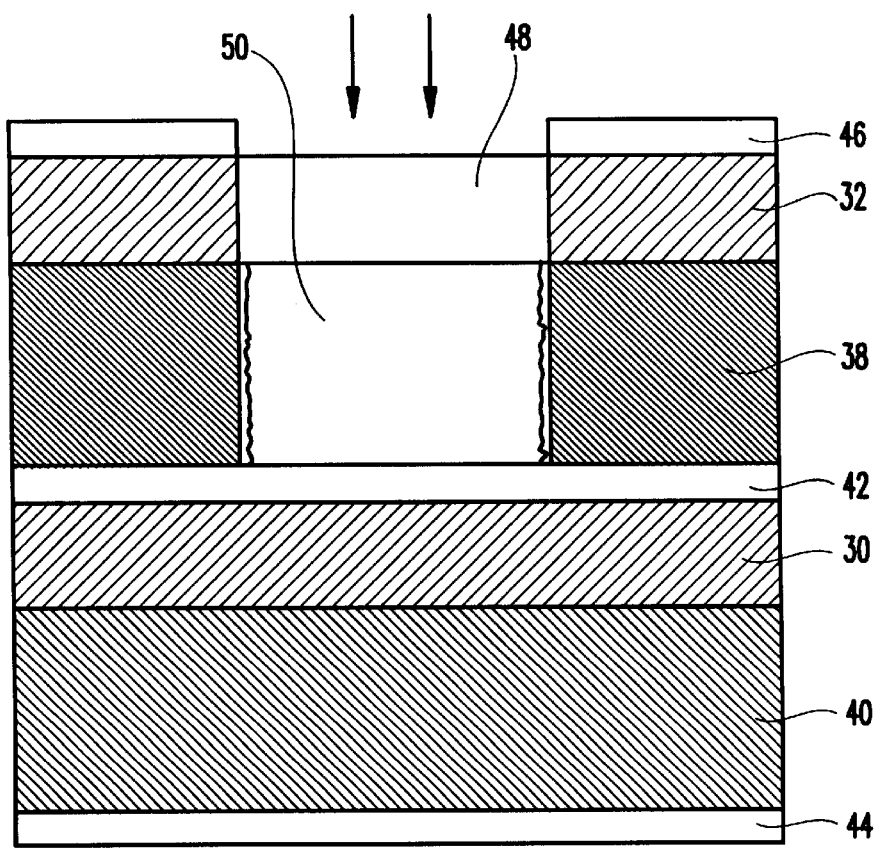
Figure 3C:
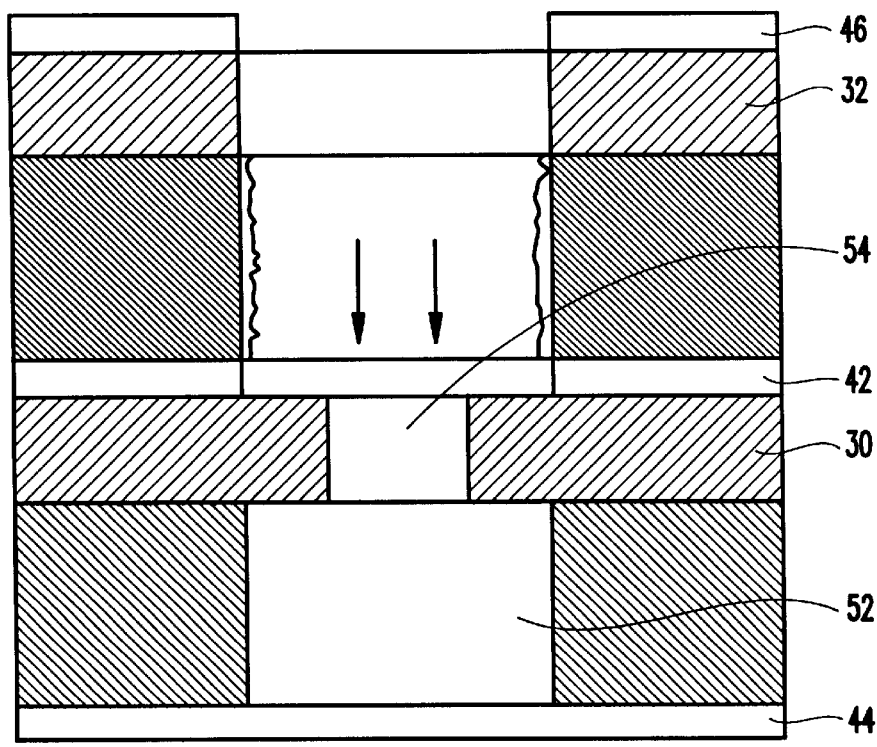
Figure 4:
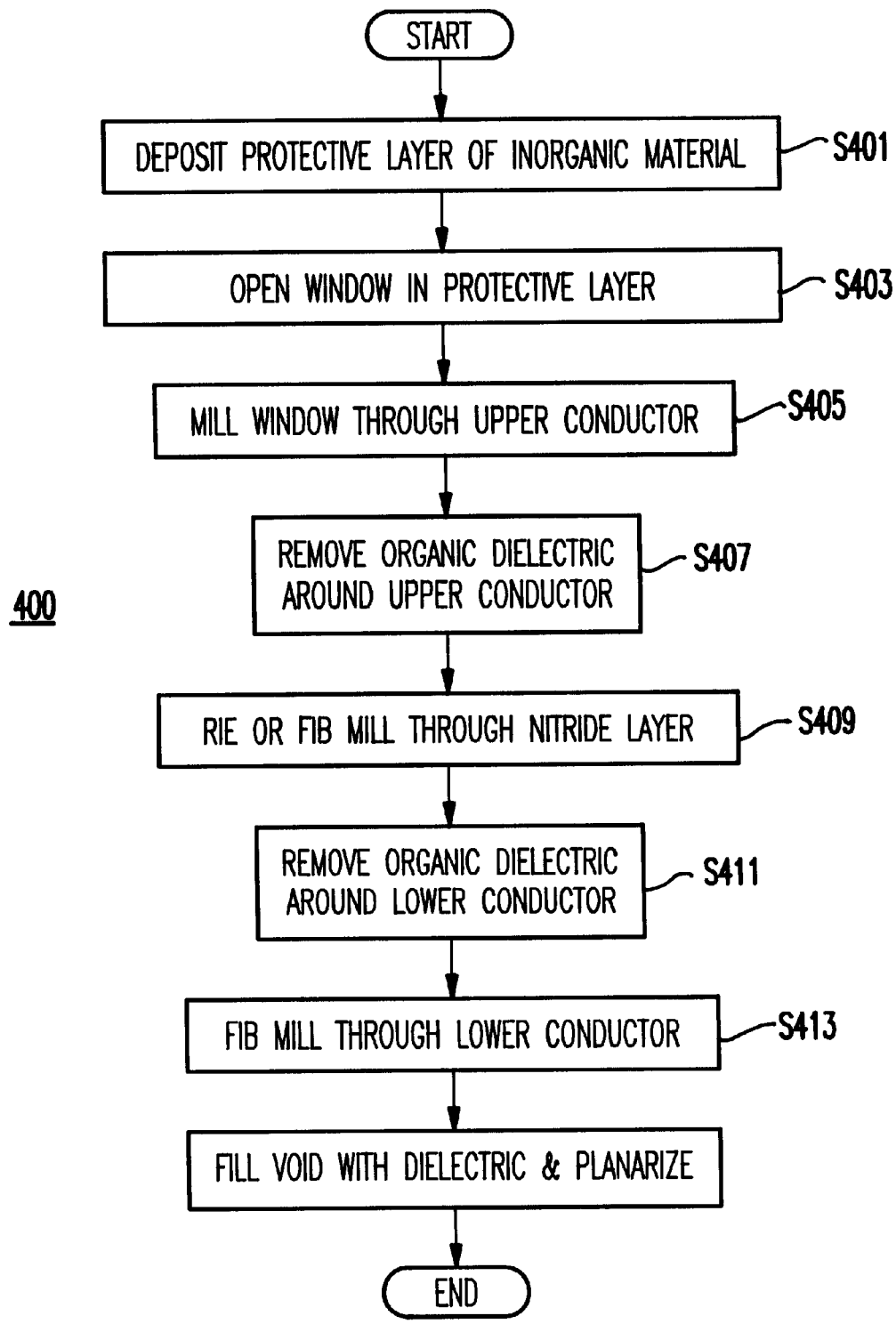
FIG. 4 is a flow chart for a preferred method 400 as extended to multiple layers, as illustrated by FIGS. 3(a) through 3(c).

FIGS. 3(a)–3(c), as summarized by the flowchart in FIG. 4, illustrate an extension of the basic technique for multiple layers. FIG. 3(a) shows a planar view of a surface conductor 32. An underlying conductor 30 is the target to be modified. The overlying conductor 32 is shown as an Mx copper wide line and the underlying conductor 30 is shown as an Mx−1 copper line but other scenarios would be obvious from the following discussion. To reach the underlying conductor 30, a first window 34 is opened in the upper conductor 32 and then a second window 36 is opened to allow removal of the dielectric around lower conductor 30. Any number of layers can be reached using a repeated process of the basic technique discussed above with variations to accommodate specific aspects of each circuit.

FIG. 3(b) shows upper conductor 32 in upper organic dielectric layer 38 and lower conductor 30 in lower organic dielectric layer 40. Isolation layer 42 separates the upper and lower layers, and lower layer 40 has a bottom isolation layer 44 separating the lower layer 40 from another (not shown) lower layer.

FIG. 4 shows a method 400 in which a protective layer 46 is applied (S401), followed by window opening of protective layer 46 (S403) to expose a work area of the upper conductor 32. Note that in this example the upper conductor is actually larger than the target work area and so there is no way to remove organic dielectric around the sides of the upper conductor. So in this case, unlike the single-conductor technique discussed above, the upper conductor 32 is milled (S405) before evacuating the associated dielectric 38 (S407). In this example any sidewall deposition of copper is acceptable since no isolation is needed due to the isolation nitride barrier 42 and because the wide line upper conductor 32 completely covers the organic layer in the work area.

This milling leaves hole 48 in upper conductor 32. The removal (S407) of organic dielectric underlying the upper conductor 32 would typically be by FIB milling followed by oxygen RIE deep enough to reach nitride barrier layer 42, leaving void 50 under upper conductor 32. Separation nitride layer 42 is then etched away (S409) with RIE or FIB milling to create the lower window 36 (see FIG. 3(a)).

Removal (S411) of the organic dielectric 40 is required prior to milling of the conductor 30 to create void 52 around the conductor (see FIG. 3(c)). Lower conductor 30 can then be milled to create a disconnect 54 (S413) of the lower conductor. The voids 50,52 could then be filled in as appropriate with an insulator as done in the basic technique (S415).

The above disclosed technique allows conductor lines in low-k dielectrics to be selectively disconnected or selectively connected and solves the problem in the prior art in which ion milling creates charged ions that impregnate the organic dielectric to defeat electrical isolation. The inventive technique improves yields on chips having organic dielectric layers, especially on large area chips where chip interconnect defeats can be a major detractor and is especially useful when conductor lines are closely spaced.

While the invention has been described in terms of preferred embodiments, those skilled in the art will recognize that the invention can be practiced with modification within the spirit and scope of the appended claims.

What is claimed is:

1. A method for circuit modification of a microelectronic chip comprising at least one first conductor in an organic dielectric layer and at least one second conductor underlying said first conductor, said method comprising:

applying a protective inorganic surface layer on said organic dielectric;

forming a window in said protective inorganic surface layer to selectively expose an underlying portion of said organic dielectric, said window located over an area that covers a first conductor to be modified by an ion-milling process;

etching said organic dielectric through said window to selectively remove a portion of said organic dielectric adjacent to said first conductor;

performing an ion-milling process on said first conductor to etch an opening through said first conductor; and etching through at least one layer underlying said first conductor to expose a second conductor underlying said first conductor.

2. The method in claim 1, wherein said window is formed by a focused ion beam.

3. The method in claim 1, wherein said window is formed by a mask/resist process.

4. The method of claim 1, wherein said at least one conductor to be modified and said organic dielectric to be selectively removed are buried below at least one upper layer and said method further comprises successively providing an opening in each of said at least one upper layer.

5. The method in claim 1, wherein said ion-milling process done to said first conductor comprises at least one of:

milling said first conductor with a focused ion beam for etching said opening;

milling said first conductor with a focused ion beam in the presence of a passivating gas for etching said opening; and depositing, after said opening has been etched, additional conductor material using an ion-assisted deposition to interconnect said first conductor to said second conductor underlying said first conductor.

6. The method in claim 5, wherein said passivation gas comprises xenon difluoride.

7. The method in claim 1, wherein said etching of said organic dielectric comprises a reactive ion etching.

8. The method in claim 7, wherein said reactive ion etching uses one of oxygen and an oxygen compound.

9. The method in claim 1, wherein said first conductor comprises metal.

10. The method in claim 9, wherein said metal comprises copper.

11. The method in claim 1, wherein said protective inorganic surface layer includes an inorganic layer which etches selectively to the organic dielectric.

12. The method in claim 11, wherein said inorganic layer which etches selectively to the organic dielectric comprises nitride.

13. A method of preparing an electronic chip for a modification process on a conductor thereon, said method comprising:

depositing a protective inorganic surface layer onto an organic dielectric material embedding a conductor that is to be modified by an ion-milling process;

forming a window in said protective inorganic surface layer to selectively expose an underlying portion of said organic dielectric material;

etching said organic dielectric material through said window to selectively remove a portion of said organic dielectric material adjacent to said conductor;

etching an opening through said conductor; and etching through at least one layer underlying said conductor to expose a second conductor.

14. The method of claim 13, wherein said etching comprises a reactive ion etching.

15. A method of manufacturing an electronic device having at least one layer of organic dielectric, said electronic device having at least one conductor in an organic dielectric modified by an ion-milling process during said manufacturing, said method comprising:

depositing a protective inorganic surface layer onto said at least one layer of organic dielectric;

forming at least one window in said protective inorganic surface layer to selectively expose an underlying portion of said organic dielectric;

etching said organic dielectric in an area of said at least one window to selectively remove said organic dielectric;

etching an opening through said conductor; and etching through at least one layer underlying said conductor to expose a second conductor underlying said conductor.

16. The method of claim 15, wherein said etching comprises a reactive ion etching.

17. A method for circuit modification of a microelectronic chip comprising at least one conductor in an organic dielectric, said method comprising:

applying a protective inorganic surface layer on said organic dielectric;

forming at least one window in said protective inorganic surface layer to selectively expose an underlying portion of said organic dielectric;

etching said organic dielectric in an area of said at least one window to selectively remove said organic dielectric adjacent to said at least one conductor; and performing at least one process that modifies said at least one conductor, wherein said at least one conductor to be modified and said organic layer to be selectively removed are buried below at least one upper layer and said method further comprises successively providing an opening in each of said at least one upper layer, wherein said at least one of said at least one upper layer contains a second conductor obstructing said window area, and said method further comprises providing an opening in said second conductor.

18. A method for circuit modification of a microelectronic chin comprising at least one conductor embedded in an organic dielectric layer, said method comprising:

applying a protective inorganic layer onto a surface of an organic dielectric layer into which is embedded a first conductor to be modified by an ion-milling process;

opening at least one window in said protective inorganic layer to selectively expose an underlying portion of said organic dielectric;

performing at least one ion-milling process on said first conductor; and etching an opening in an underlying protective layer to gain access to a second conductor located below said first conductor of said at least one conductor.

19. The method of claim 18, further comprising:

etching said organic dielectric in an area of said at least one window to selectively remove said organic dielectric adjacent to said first conductor.

20. A method for circuit modification of a microelectronic chip comprising at least one conductor embedded in an organic dielectric layer, said method comprising:

applying a protective inorganic layer onto a surface of an organic dielectric layer into which a first conductor is embedded;

opening at least one window in said protective inorganic layer to selectively expose an underlying portion of said organic dielectric;

providing an opening in said first conductor; and etching an opening in an underlying protective layer to gain access to a second conductor located below said first conductor.

21. A method of performing one of a circuit modification and a repair on a circuit having multiple levels of conductors embedded in respective multiple layers of organic dielectric, said method comprising:

providing at least one first opening through all overlying layers to expose a first organic layer;

etching said first organic layer through said opening in overlying layers, said etching using reactive ion etching; and etching through at least one underlying isolation layer to expose a second organic layer.

22. A method of performing one of a circuit modification and repair on a circuit having multiple levels of conductors embedded in respective multiple layers of organic dielectric, at least one of said multiple layers containing a first conductor that obstructs a work area for a target second conductor located in a second lower level organic dielectric layer, said method comprising:

providing at least one first opening through all overlying layers to expose said first organic layer containing said first conductor;

etching through said first conductor an opening sufficient to create a work area for said underlying target conductor;

etching through a first underlying isolation layer to expose any underlying layers separating said first organic layer from said second organic layer containing said target conductor, and etching through said separating layers; and etching second organic layer to selectively remove organic dielectric adjacent to said target conductor using reactive ion etching.

23. A method of performing one of a circuit modification and a repair on a circuit having multiple levels of conductors embedded in respective multiple layers of organic dielectric, a first surface organic dielectric layer containing a first conductor that obstructs a work area for a target second conductor located in a second lower level organic dielectric layer, said method comprising:

applying a first protective inorganic or mask layer;

providing an opening through said first protective inorganic or mask layer over a target conductor;

through this opening, etching said first conductor to form an opening sufficient to create a work area for said underlying target conductor;

etching through a first underlying isolation layer to expose any underlying layers separating said first organic layer from a second organic layer containing said target conductor;

etching through said separating layers; and etching a second organic layer using a reactive ion etching to selectively remove organic dielectric adjacent to said target conductor.

* * * * *